(12) United States Patent
Das et al.

(10) Patent No.: US 9,680,488 B2
(45) Date of Patent: *Jun. 13, 2017

(54) SWITCHABLE SECONDARY PLAYBACK PATH

(71) Applicant: Cirrus Logic, Inc., Austin, TX (US)

(72) Inventors: Tejasvi Das, Austin, TX (US); John L. Melanson, Austin, TX (US); John C. Tucker, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/050,857

(22) Filed: Feb. 23, 2016

(65) Prior Publication Data

US 2016/0173112 A1    Jun. 16, 2016

Related U.S. Application Data

(63) Continuation of application No. 14/680,830, filed on Apr. 7, 2015, now Pat. No. 9,306,588.

(Continued)

(51) Int. Cl.
*H03M 1/78* (2006.01)
*H03M 1/00* (2006.01)
(Continued)

(52) U.S. Cl.
CPC ......... *H03M 1/002* (2013.01); *H03M 1/0845* (2013.01); *H03M 1/66* (2013.01);
(Continued)

(58) Field of Classification Search
CPC .... H03M 1/002; H03M 1/662; H03M 1/0845; H03M 1/785; H03M 1/70; H03M 1/66; H03M 1/68
(Continued)

(56) References Cited

U.S. PATENT DOCUMENTS

| | | |
|---|---|---|
| 4,446,440 A | 5/1984 | Bell |
| 4,493,091 A | 1/1985 | Gundry |

(Continued)

FOREIGN PATENT DOCUMENTS

| | | |
|---|---|---|
| EP | 0966105 A2 | 12/1999 |
| EP | 1575164 A2 | 9/2005 |

(Continued)

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.

(Continued)

*Primary Examiner* — Khai M Nguyen
(74) *Attorney, Agent, or Firm* — Jackson Walker L.L.P.

(57) ABSTRACT

In accordance with embodiments of the present disclosure, a processing system may include a plurality of processing paths including a first processing path and a second processing path, a digital-to-analog stage output, and a controller. The first processing path may include a first digital-to-analog converter for converting the digital input signal into a first intermediate analog signal, the first digital-to-analog converter configured to operate in a high-power state and a low-power state. The second processing path may include a second digital-to-analog converter for converting a digital input signal into a second intermediate analog signal. The digital-to-analog stage output may be configured to generate an analog signal comprising a sum of the first intermediate analog signal and the second intermediate analog signal. The controller may be configured to operate the first digital-to-analog converter in the lower-power state when a magnitude of the digital input signal is below a threshold magnitude.

22 Claims, 5 Drawing Sheets

Related U.S. Application Data

(60) Provisional application No. 61/979,308, filed on Apr. 14, 2014.

(51) Int. Cl.
  *H03M 1/08* (2006.01)
  *H03M 1/66* (2006.01)
  *H03M 1/70* (2006.01)
  *H03M 1/68* (2006.01)
  *H03M 3/00* (2006.01)

(52) U.S. Cl.
  CPC ............. *H03M 1/662* (2013.01); *H03M 1/68* (2013.01); *H03M 1/70* (2013.01); *H03M 1/785* (2013.01); *H03M 3/392* (2013.01); *H03M 3/32* (2013.01); *H03M 3/414* (2013.01); *H03M 3/416* (2013.01); *H03M 3/50* (2013.01)

(58) Field of Classification Search
  USPC ................. 341/76–77, 139, 143, 144, 154
  See application file for complete search history.

(56) References Cited

U.S. PATENT DOCUMENTS

| | | |
|---|---|---|
| 4,972,436 A | 11/1990 | Halim et al. |
| 4,999,628 A | 3/1991 | Kakaubo et al. |
| 4,999,830 A | 3/1991 | Agazzi |
| 5,148,167 A | 9/1992 | Ribner |
| 5,198,814 A * | 3/1993 | Ogawara ............ H03M 1/1047 341/118 |
| 5,321,758 A | 6/1994 | Charpentier et al. |
| 5,323,159 A | 6/1994 | Imamura et al. |
| 5,550,923 A | 8/1996 | Hotvet et al. |
| 5,600,317 A | 2/1997 | Knoth et al. |
| 5,714,956 A | 2/1998 | Jahne et al. |
| 5,808,575 A | 9/1998 | Himeno et al. |
| 5,810,477 A | 9/1998 | Abraham et al. |
| 6,088,461 A | 7/2000 | Lin |
| 6,201,490 B1 | 3/2001 | Kawano et al. |
| 6,271,780 B1 | 8/2001 | Gong et al. |
| 6,353,404 B1 | 3/2002 | Kuroiwa |
| 6,542,612 B1 | 4/2003 | Needham |
| 6,745,355 B1 | 6/2004 | Tamura |
| 6,768,443 B2 | 7/2004 | Willis |
| 6,822,595 B1 * | 11/2004 | Robinson ...................... 341/144 |
| 6,853,242 B2 | 2/2005 | Melanson et al. |
| 6,888,888 B1 | 5/2005 | Tu et al. |
| 6,897,794 B2 * | 5/2005 | Kuyel ................. H03M 1/1038 341/120 |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,312,734 B2 | 12/2007 | McNeill et al. |
| 7,365,664 B2 | 4/2008 | Caduff et al. |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 * | 3/2010 | De Ceuninck ...... H03M 1/1047 341/118 |
| 7,679,538 B2 * | 3/2010 | Tsang ............................ 341/144 |
| 7,893,856 B2 * | 2/2011 | Ek et al. ........................ 341/144 |
| 8,060,663 B2 | 11/2011 | Murray et al. |
| 8,289,425 B2 | 10/2012 | Kanbe |
| 8,330,631 B2 | 12/2012 | Kumar et al. |
| 8,362,936 B2 | 1/2013 | Ledzius et al. |
| 8,462,035 B2 * | 6/2013 | Schimper ............ H03M 1/0881 341/145 |
| 8,508,397 B2 | 8/2013 | Hisch |
| 8,717,211 B2 | 5/2014 | Miao et al. |
| 8,836,551 B2 | 9/2014 | Nozaki |
| 8,873,182 B2 | 10/2014 | Liao et al. |
| 8,952,837 B2 * | 2/2015 | Kim et al. .................... 341/143 |
| 9,071,267 B1 | 6/2015 | Schneider et al. |
| 9,071,268 B1 | 6/2015 | Schneider et al. |
| 9,148,164 B1 | 9/2015 | Schneider et al. |
| 9,306,588 B2 | 4/2016 | Das et al. |
| 9,337,795 B2 | 5/2016 | Das et al. |
| 9,391,576 B1 | 7/2016 | Satoskar et al. |
| 9,503,027 B2 | 11/2016 | Zanbaghi |
| 9,525,940 B1 | 12/2016 | Schneider et al. |
| 9,543,975 B1 | 1/2017 | Melanson et al. |
| 2001/0009565 A1 | 7/2001 | Singvall |
| 2004/0184621 A1 | 9/2004 | Andersen et al. |
| 2005/0258989 A1 | 11/2005 | Li et al. |
| 2005/0276359 A1 | 12/2005 | Xiong |
| 2006/0056491 A1 | 3/2006 | Lim et al. |
| 2006/0098827 A1 | 5/2006 | Paddock et al. |
| 2006/0284675 A1 | 12/2006 | Krochmal et al. |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2008/0030577 A1 | 2/2008 | Cleary et al. |
| 2008/0159444 A1 | 7/2008 | Terada |
| 2008/0198048 A1 | 8/2008 | Klein et al. |
| 2009/0021643 A1 | 1/2009 | Hsueh et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0228952 A1 | 9/2011 | Lin |
| 2011/0242614 A1 | 10/2011 | Okada |
| 2012/0001786 A1 | 1/2012 | Hisch |
| 2012/0047535 A1 | 2/2012 | Bennett et al. |
| 2012/0133411 A1 | 5/2012 | Miao et al. |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |
| 2012/0242521 A1 | 9/2012 | Kinyua |
| 2012/0250893 A1 | 10/2012 | Carroll et al. |
| 2012/0263090 A1 | 10/2012 | Porat et al. |
| 2012/0280726 A1 | 11/2012 | Colombo et al. |
| 2013/0106635 A1 | 5/2013 | Doi |
| 2013/0188808 A1 | 7/2013 | Pereira et al. |
| 2014/0105256 A1 | 4/2014 | Hanevich et al. |
| 2014/0105273 A1 | 4/2014 | Chen et al. |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2015/0009079 A1 | 1/2015 | Bojer |
| 2015/0214974 A1* | 7/2015 | Currivan ...................... 341/144 |
| 2015/0214975 A1* | 7/2015 | Gomez et al. ................ 341/144 |
| 2015/0295584 A1 | 10/2015 | Das et al. |
| 2015/0381130 A1 | 12/2015 | Das et al. |
| 2016/0072465 A1 | 3/2016 | Das et al. |
| 2016/0080862 A1 | 3/2016 | He et al. |
| 2016/0080865 A1 | 3/2016 | He et al. |
| 2016/0173112 A1 | 6/2016 | Das et al. |
| 2016/0286310 A1 | 9/2016 | Das et al. |
| 2016/0365081 A1 | 12/2016 | Satoskar et al. |

FOREIGN PATENT DOCUMENTS

| | | |
|---|---|---|
| EP | 1753130 A1 | 2/2007 |
| EP | 1798852 A2 | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |

(56) References Cited

FOREIGN PATENT DOCUMENTS

| GB | 2527677 B | 10/2016 |
|---|---|---|
| GB | 2539517 A | 12/2016 |
| JP | 2008294803 A | 12/2008 |
| WO | WO0054403 A1 | 9/2000 |
| WO | 02/37686 A2 | 5/2002 |
| WO | 2008067260 A1 | 6/2008 |
| WO | 2014113471 A1 | 7/2014 |
| WO | 2015160655 A1 | 10/2015 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |

OTHER PUBLICATIONS

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.
GB Patent Application No. 1419651.3, Improved Analogue-to-Digital Convertor, filed Nov. 4, 2014, 65 pages.
Combined Search and Examination Report, GB Application No. GB1506258.1, Oct. 21, 2015, 6 pages.
International Search Report and Written Opinion, International Patent Application No. PCT/US2015/025329, mailed Aug. 11, 2015, 9 pages.
International Search Report and Written Opinion, International Patent Application No. PCT/US2015/048633, mailed Dec. 10, 2015, 11 pages.
International Search Report and Written Opinion, International Patent Application No. PCT/US2015/048591, mailed Dec. 10, 2015, 11 pages.
Combined Search and Examination Report, GB Application No. GB1510578.6, Aug. 3, 2015, 3 pages.
International Search Report and Written Opinion, International Application No. PCT/US2015/056357, mailed Jan. 29, 2015, 13 pages.
Combined Search and Examination Report, GB Application No. GB1514512.1, Feb. 11, 2016, 7 pages.
International Search Report and Written Opinion, International Application No. PCT/US2015/048609, mailed Mar. 23, 2016, 23 pages.
International Search Report and Written Opinion, International Application No. PCT/US2016/022578, mailed Jun. 22, 2016, 12 pages.
Combined Search and Examination Report, GB Application No. GB16005282, Jul. 7, 2016, 8 pages.
Combined Search and Examination Report, GB Application No. GB1603628.7, Aug. 24, 2016, 6 pages.
International Search Report and Written Opinion, International Application No. PCT/EP2016/062862, mailed Aug. 26, 2016, 14 pages.
Combined Search and Examination Report, GB Application No. GB1602288.1, Aug. 9, 2016, 6 pages.
International Search Report and Written Opinion of the International Searching Authority, International Application No. PCT/US2016/065134, mailed Mar. 15, 2017.
International Search Report and Written Opinion of the International Searching Authority, International Application No. PCT/US2016/040096, mailed Mar. 24, 2017.

* cited by examiner

SWITCHABLE SECONDARY PLAYBACK PATH

RELATED APPLICATION

The present application is a continuation of U.S. Non-Provisional application Ser. No. 14/680,830, filed on Apr. 7, 2015, which claims priority to U.S. Provisional Patent Application Ser. No. 61/979,308, filed Apr. 14, 2014, both of which are incorporated by reference herein in their entirety.

FIELD OF DISCLOSURE

The present disclosure relates in general to circuits for audio devices, including without limitation personal audio devices, such as wireless telephones and media players, and more specifically, to an audio integrated circuit including a switchable secondary playback path.

BACKGROUND

Personal audio devices, including wireless telephones, such as mobile/cellular telephones, cordless telephones, MP3 players, and other consumer audio devices, are in widespread use. Such personal audio devices may include circuitry for driving a pair of headphones or one or more speakers. Such circuitry often includes a speaker driver, including a power amplifier for driving an audio output signal to headphones or speakers.

One existing approach to driving an audio output signal is to employ a playback path for including an active digital-to-analog converter for converting a digital audio signal into an intermediate analog signal, and an output amplifier for amplifying the analog signal to generate the audio output signal. However, the digital-to-analog converter may undesirably consume significant amounts of power.

SUMMARY

In accordance with the teachings of the present disclosure, one or more disadvantages and problems associated with existing approaches to audio playback paths may be reduced or eliminated.

In accordance with embodiments of the present disclosure, a processing system may include a plurality of processing paths including a first processing path and a second processing path, a digital-to-analog stage output, and a controller. The first processing path may include a first digital-to-analog converter for converting the digital input signal into a first intermediate analog signal, the first digital-to-analog converter configured to operate in a high-power state and a low-power state. The second processing path may include a second digital-to-analog converter for converting a digital input signal into a second intermediate analog signal. The digital-to-analog stage output may be configured to generate an analog signal comprising a sum of the first intermediate analog signal and the second intermediate analog signal. The controller may be configured to operate the first digital-to-analog converter in the lower-power state when a magnitude of the digital input signal is below a threshold magnitude.

In accordance with these and other embodiments of the present disclosure, a method may include generating a first intermediate analog signal with a first processing path comprising a first digital-to-analog converter for converting a digital input signal into the first intermediate analog signal, the first digital-to-analog converter configured to operate in a high-power state and a low-power state. The method may also include generating a second intermediate analog signal with a second processing path comprising a second digital-to-analog converter for converting the digital input signal into the second intermediate analog signal. The method may further include generating an analog signal comprising a sum of the first intermediate analog signal and the second intermediate analog signal. The method may additionally include operating the first digital-to-analog converter in the lower-power state when the digital input signal is below a threshold magnitude.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
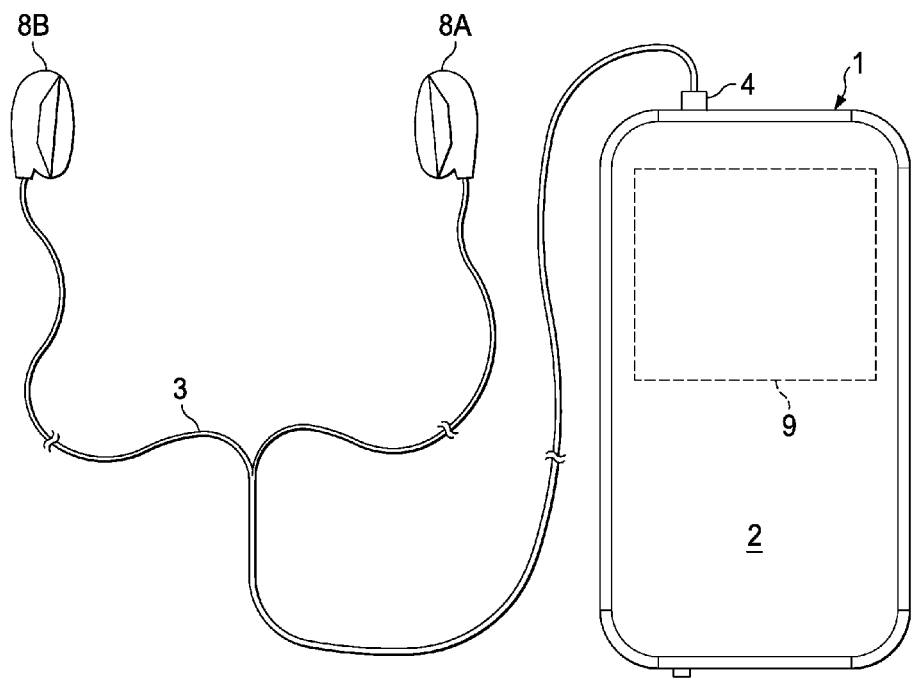
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
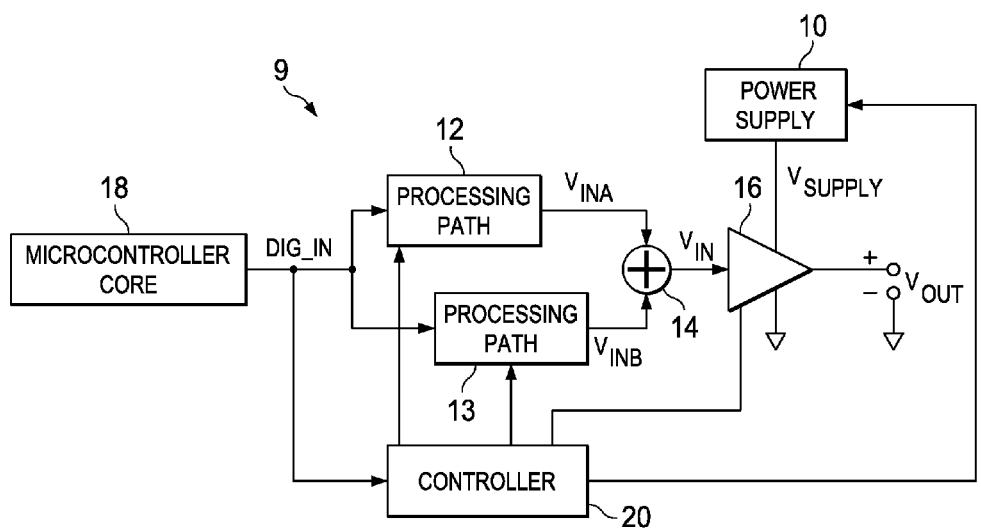
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital audio input signal DIG_IN to each of a first processing path 12 and a second processing path 13, which may respectively process and convert the digital audio input signal to a first intermediate analog signal $V_{INA}$ and a second intermediate analog signal $V_{INB}$. A combiner 14 may combine (e.g., sum) first intermediate analog signal $V_{INA}$ and second intermediate analog signal $V_{INB}$ to generate analog signal $V_{IN}$. Thus, the combination of first processing path 12, second processing path 13, and combiner 14 may serve as a digital-to-analog stage configured to generate an analog signal at the output of the digital-to-analog stage comprising a sum or other combination of first intermediate analog signal $V_{INA}$ and second intermediate analog signal $V_{INB}$. Although shown as single-ended signals in FIG. 2, in some embodiments, first intermediate analog signal $V_{INA}$, second intermediate analog signal $V_{INB}$ and/or analog signal $Y_{IN}$ may comprise a differential signal. In addition, although FIG. 2 depicts two processing paths 12 and 13, audio IC 9 may comprise any suitable number of processing paths.

Combiner 14 may supply analog signal $Y_{IN}$ to an amplifier stage 16 which may amplify or attenuate audio input signal $V_{IN}$ to provide an audio output signal $Y_{OUT}$, which may operate a speaker, headphone transducer, a line level signal output, and/or other suitable output. Although shown as a single-ended signal in FIG. 2, in some embodiments, audio output signal $V_{OUT}$ may comprise a differential signal. A power supply 10 may provide the power supply rail inputs of amplifier stage 16. In some embodiments, power supply 10 may comprise a battery.

As shown in FIG. 2, audio IC 9 may include a controller 20 configured to, based on digital audio input signal DIG_IN, control operation of one or more of first processing path 12, second processing path 13, and amplifier stage 16. For example, in some embodiments, a digital-to-analog converter of processing path 12 may be configured to operate in a high-power state (e.g., fully operational) and a low-power state (e.g., powered off, powered down to a standby state, etc.), and controller 20 may operate such digital-to-analog converter in one of the high-power state or low-power state based on a magnitude of digital audio input signal DIG_IN, as described in greater detail below. In these and other embodiments, controller 20 may, when the magnitude of the digital audio input signal DIG_IN is below a threshold magnitude, cause first processing path 12 to output first intermediate analog signal $V_{INA}$ having an approximately zero magnitude, as described in greater detail below. In these and other embodiments, controller 20 may, when the magnitude of digital audio input signal DIG_IN is above the threshold magnitude, cause second processing path 13 to output second intermediate analog signal $V_{INB}$ having an approximately zero magnitude, as described in greater detail below. In these and other embodiments, controller 20 may vary relative gains of first processing path 12 and second processing path 13 based on the magnitude of digital audio input signal DIG_IN, as described in greater detail below. In these and other embodiments, portions of first processing path 12 and second processing path 13 may be implemented as a multi-stage noise-shaping (MASH) structure, and in such embodiments, controller 20 may cause portions of the multi-stage noise-shaping structure to operate in a lower-power mode and/or control which portions of the multi-stage noise-shaping structure process digital audio input signal DIG_IN, as described in greater detail below.

Figure 3:
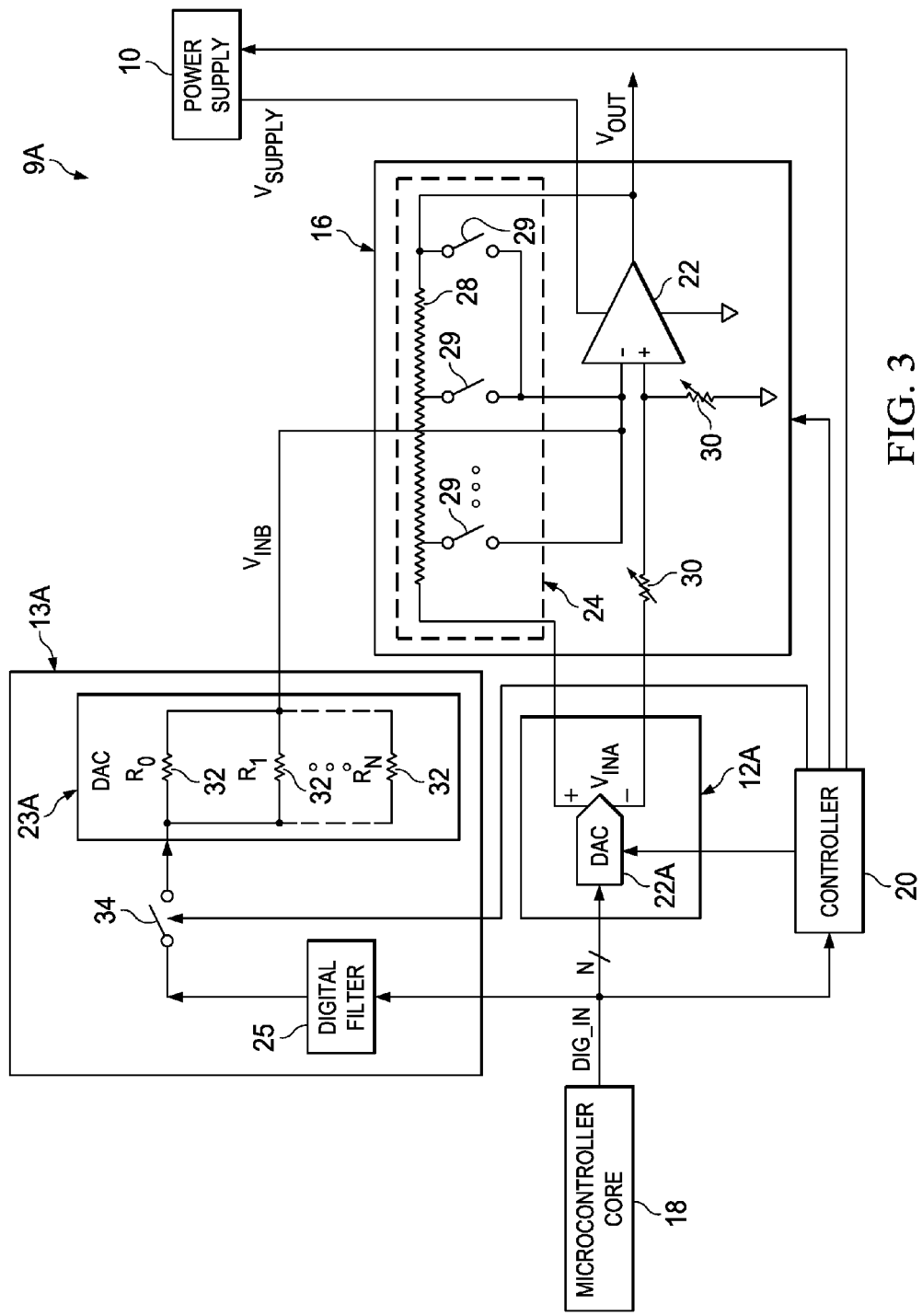
FIG. 3 illustrates a block diagram of selected components of an example integrated circuit, with detail depicting selected components of processing paths and an amplifier, in accordance with embodiments of the present disclosure.

FIG. 3 illustrates a block diagram of selected components of an example IC circuit 9A, with detail depicting selected components of processing paths 12A and 13A and amplifier stage 16, in accordance with embodiments of the present disclosure. In some embodiments, audio IC 9A depicted in FIG. 3 may implement all or a portion of audio IC 9 described with respect to FIG. 2. As shown in FIG. 3, microcontroller core 18 may supply digital audio input signal DIG_IN to each of a first processing path 12A and a second processing path 13A. In some embodiments, first processing path 12A and second processing path 13A depicted in FIG. 3 may respectively implement all or a portion of first processing path 12 and second processing path 13 described with respect to FIG. 2.

First processing path 12A may comprise a digital-to-analog converter (DAC) 22A, which may convert digital audio input signal DIG_IN into first intermediate analog signal $V_{INA}$. DAC 22A may comprise a delta-sigma modulator and/or any other system or device for performing the functionality thereof. As shown in FIG. 3, controller 20 may communicate one or more control signals to DAC 22A configured to control operation of DAC 22A, as described in greater detail below.

Second processing path 13A may comprise a DAC 23A, which may convert digital audio input signal DIG_IN into second intermediate analog signal $V_{INB}$. As shown in FIG. 3, DAC 23A may comprise a resistor ladder comprising a plurality of resistors 32 each coupled to each other at respective first terminals and each coupled at their respective second terminals to a corresponding driver (e.g., output drivers of microncontroller core 18) driving a signal indicative of the value of a single bit of digital audio input signal DIG_IN. The resistances of the individual resistors 32 may be based on the type of signal encoding used. For example, in a thermometer coding implementation, resistors 32 may have approximately equal resistances, such that DAC 23A may convert digital audio input signal DIG_IN into second intermediate analog signal $V_{INB}$ by applying each bit of digital audio input signal DIG_IN to a corresponding resistor 32, such that the second intermediate analog signal $V_{INB}$ has a magnitude corresponding to the number of asserted bits of digital audio input signal DIG_IN. As another example, in traditional digital encoding in which each bit has a different weight (e.g., each bit other than a least significant bit has a weight twice that of another bit), the resistances of resistors 32 may be weighted in accordance with the weight of the bits. Also as shown in FIG. 3, controller 20 may communicate one or more control signals to second processing path 13A configured to control operation of second processing path 13A, as described in greater detail below. For instance, in some embodiments, controller 20 may control a switch 34 of second processing path 13A, such that when switch 34 is activated (e.g., closed, enabled, turned on), DAC 23A may communicate a signal to amplifier stage 16 (e.g., to an inverting terminal of an operational amplifier internal to amplifier stage 16), as described in greater detail below. On the other hand, when switch 34 is deactivated (e.g., opened, disabled, turned off), DAC 23A may not communicate a signal to amplifier stage 16.

Also as depicted in FIG. 3, second processing path 13A may comprise a digital filter 25. Digital filter 25 may comprise any system, device, or apparatus configured to perform mathematical operations on a digital signal (e.g., digital audio input signal DIG_IN output by microcontroller core 18) to reduce or enhance certain aspects of such digital signal. For example, in some embodiments, digital filter 25 may provide delay matching between first processing path 12A and second processing path 13A. Although digital filter 25 is shown interfaced between microcontroller core 18 and switch 34, digital filter 25 may be placed at any suitable location within processing path 13A. In addition, in other embodiments of the present disclosure, digital filter 25 may be replaced with a delay element configured to time delay digital audio input signal DIG_IN by a desired amount.

Due to their different architectures, DAC 22A and DAC 23A may have different signal processing capabilities and performance. For example, DAC 23A may, when converting digital audio input signal DIG_IN into second intermediate analog signal $V_{INB}$, consume less power than does DAC 22A when converting digital audio input signal DIG_IN into first intermediate analog signal $V_{INA}$. As another example, DAC 22A may introduce lesser noise into first processing path 12A relative to noise introduced into second processing path 13A by DAC 23A. As a further example, at larger magnitudes of digital audio input signal DIG_IN, DAC 22A may provide a higher linearity in converting digital audio input signal DIG_IN into first intermediate analog signal $V_{INA}$ relative to that of DAC 23A in converting digital audio input signal DIG_IN into second intermediate analog signal $V_{INB}$.

Accordingly, controller 20 may operate such that when a magnitude of digital audio input signal DIG_IN is greater than a threshold magnitude (e.g., at 20 decibels below full-scale magnitude of digital audio input signal DIG_IN), controller 20 may in essence select first processing path 12A as the active processing path, while masking or disabling second processing path 13A, in order to ensure linearity of analog signal $V_{IN}$ being communicated to amplifier stage 16. For instance, for a magnitude of digital audio input signal DIG_IN greater than a threshold magnitude, controller 20 may communicate one or more control signals to DAC 22A indicating that DAC 22A is to operate in its high-power mode, while communicating one or more control signals to second processing path 13A, indicating that the output of DAC 23A should not be communicated to amplifier stage 16 (e.g., by deactivating switch 34). Accordingly, when the magnitude of digital audio input signal DIG_IN is above the threshold magnitude, controller 20 may cause second processing path 13A to output second intermediate analog signal $V_{INB}$ having an approximately zero magnitude.

On the other hand, controller 20 may operate such that when a magnitude of digital audio input signal DIG_IN is lesser than the threshold magnitude, controller 20 may in essence select second processing path 13A as the active processing path, while masking or disabling first processing path 12A, in order to minimize power consumption of audio IC 9, while operating DAC 23A at a signal magnitude in which it may provide adequate linearity of first intermediate analog signal $V_{INB}$ communicated to amplifier stage 16. For instance, for a magnitude of digital audio input signal DIG_IN lesser than a threshold magnitude, controller 20 may communicate one or more control signals to DAC 22A indicating that DAC 22A is to operate in its low-power mode. Such one or more control signals may also cause first processing path 12A to output first intermediate analog signal $V_{INA}$ having an approximately zero magnitude. In addition, for a magnitude of digital audio input signal DIG_IN lesser than a threshold magnitude, controller 20 may communicate one or more control signals to second processing path 13A, indicating that the output of DAC 23A is to be communicated to amplifier stage 16 (e.g., by activating switch 34). When the magnitude of digital audio input signal DIG_IN is lesser than the threshold magnitude, operational amplifier 22 of amplifier stage 16 may effectively operate as a transinductance amplifier.

As shown in FIG. 3, amplifier stage 16 may comprise an operational amplifier 22, a switched resistor network 24 comprising a resistor string 28 having a plurality of taps each coupled to a corresponding switch 29, and a plurality of variable resistors 30 including at least one variable resistor 30 coupled between a negative input terminal of amplifier stage 16 of the positive input of operational amplifier 22 and one variable resistor 30 coupled between the positive input of operational amplifier 22 and a ground voltage. To apply a desired analog gain to amplifier stage 16, switches 29 may be selectively opened and closed to create an effective resistance between a negative input of operational amplifier 22 and the output of operational amplifier 22, and the resistances of variable resistors 30 may be set appropriately. In some embodiments, switches 29 and variable resistors 30 may be controlled by controller 20. Although FIG. 3 depicts a particular architecture for providing analog gain of amplifier stage 16, other suitable architectures may be applied in accordance with this disclosure. As described above, second processing path 13A may output second intermediate analog signal $V_{INB}$ to the negative input of operational amplifier 22. Accordingly, such negative input of operational amplifier 22 may operate as combiner 14 of FIG. 2, thus effectively summing first intermediate analog signal $V_{INA}$ and second intermediate analog signal $V_{INB}$, wherein the value of one of such inputs to such negative input may be approximately zero. In some embodiments, controller 20 may control the analog gain of amplifier stage 16 based on the magnitude of digital audio input signal DIG_IN, an identity of which of first processing path 12A and second processing path 13A is selected as an active processing path, and/or another suitable characteristic of audio IC 9A. In these and other embodiments, controller 20 may communicate one or more control signals to power supply 10, indicating an operational mode in which to operate or a supply voltage to output. For example, controller 20 may cause power supply 10 to output a supply voltage based on a magnitude of digital audio input signal DIG_IN, such that a higher supply voltage is provided for higher-magnitude signals and a lower supply voltage is provided for lower-magnitude signals, which may allow amplifier stage 16 to operate at decreased power levels when processing lower magnitude signals.

Figure 4:
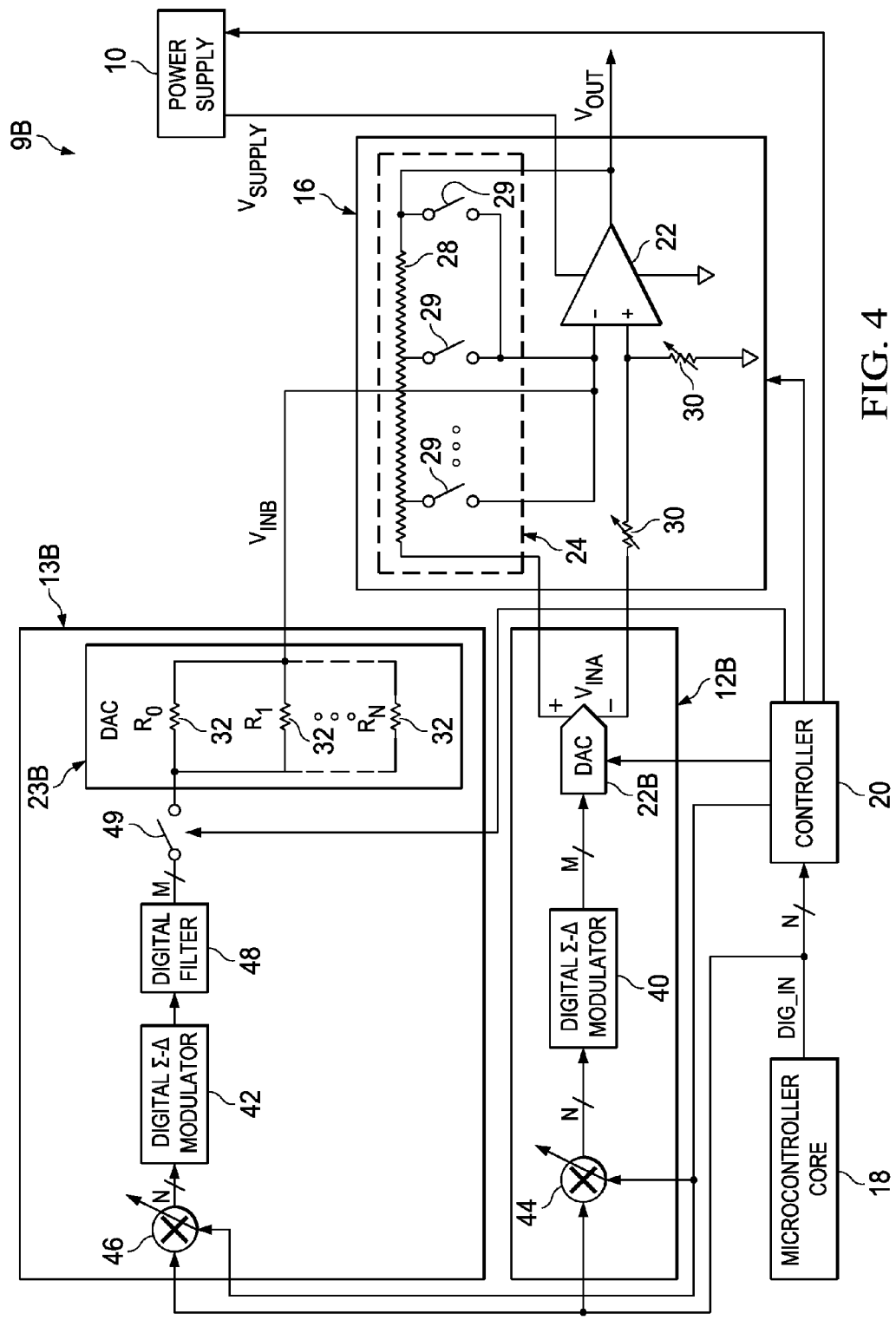
FIG. 4 illustrates a block diagram of selected components of another example integrated circuit, with detail depicting selected components of processing paths and an amplifier, in accordance with embodiments of the present disclosure.

FIG. 4 illustrates a block diagram of selected components of an example audio IC 9B, with detail depicting selected components of processing paths 12B and 13B and amplifier 16, in accordance with embodiments of the present disclosure. In some embodiments, audio IC 9B depicted in FIG. 4 may implement all or a portion of audio IC 9 described with respect to FIG. 2. As shown in FIG. 4, microcontroller core 18 may supply digital audio input signal DIG_IN to each of a first processing path 12B and a second processing path 13B. In some embodiments, first processing path 12B and second processing path 13B depicted in FIG. 4 may respectively implement all or a portion of first processing path 12 and second processing path 13 described with respect to FIG. 2.

First processing path 12B may comprise a gain element 44, a digital delta-sigma modulator 40, and a DAC 22B. Gain element 44 may comprise any system, device, or apparatus for applying a first gain of gain element 44 to digital audio input signal DIG_IN and communicating the resulting signal to digital delta-sigma modulator 40. The first gain of gain element 44 may be controlled based on one or more control signals received from controller 20, as described in greater detail below. Although gain element 44 is shown as a digital gain element interfaced between microcontroller core 18 and digital delta-sigma modulator 40, gain element 44 may be placed at any suitable location within processing path 12B, and may in some embodiments comprise an analog gain element placed at or downstream of the output of DAC 22B.

Digital delta-sigma modulator 40 may comprise any suitable system, device or apparatus configured to, in the digital domain, process a first digital signal (e.g., digital audio input signal DIG_IN as modified by the first gain of gain element 44) to convert the first digital signal into a resulting second digital signal, which may or may not have the same number of bits as the first digital signal. In some embodiments, the resulting second digital signal may have two quantization levels (e.g., a single-bit signal or any other digital signal having two quantization levels). An example embodiment of digital delta-sigma modulator 40 is set forth in U.S. patent application Ser. No. 14/247,686 by John L. Melanson et al., filed on Apr. 8, 2014, and entitled "Systems and Methods for Generating a Digital Output Signal in a Digital Microphone System."

DAC 22B may receive the digital signal output by digital delta-sigma modulator 40 and convert such signal into first intermediate analog signal $V_{INA}$. As shown in FIG. 4, controller 20 may communicate one or more control signals to DAC 22B configured to control operation of DAC 22B, as described in greater detail below.

Second processing path 13B may comprise a gain element 46, a digital delta-sigma modulator 42, a digital filter 48, a switch 29, and a DAC 23B. Gain element 46 may comprise any system, device, or apparatus for multiplying a second gain of gain element 46 to digital audio input signal DIG_IN and communicating the resulting signal to digital delta-sigma modulator 42. The second gain of gain element 46 may be controlled based on one or more control signals received from controller 20, as described in greater detail below. Although gain element 46 is shown as a digital gain element interfaced between microcontroller core 18 and digital delta-sigma modulator 42, gain element 46 may be placed any suitable location within processing path 13B, and may in some embodiments comprise an analog gain element placed at or downstream of the output of DAC 23B.

Digital delta-sigma modulator 42 may comprise any suitable system, device or apparatus configured to, in the digital domain, process a first digital signal (e.g., digital audio input signal DIG_IN as modified by the second gain of gain element 46) to convert the first digital signal into a resulting second digital signal, which may or may not have the same number of bits as the first digital signal. In some embodiments, the resulting second digital signal may have two quantization levels (e.g., a single-bit signal or any other digital signal having two quantization levels). An example embodiment of digital delta-sigma modulator 42 is set forth in U.S. patent application Ser. No. 14/247,686 by John L. Melanson et al., filed on Apr. 8, 2014, and entitled "Systems and Methods for Generating a Digital Output Signal in a Digital Microphone System."

Digital filter 48 may comprise any system, device, or apparatus configured to perform mathematical operations on a digital signal (e.g., the signal output by digital sigma-delta modulator 42) to reduce or enhance certain aspects of such digital signal. For example, in some embodiments, digital filter 48 may provide delay matching between first processing path 12B and second processing path 13B. Although digital filter 48 is shown interfaced between digital delta-sigma modulator 42 and DAC 23B, digital filter 48 may be placed at any suitable location within processing path 13B. In addition, in other embodiments of the present disclosure, digital filter 48 may be replaced with a delay element configured to time delay the signal output by digital delta-sigma modulator 42 by a desired amount.

Controller 20 may communicate one or more control signals to second processing path 13B configured to control operation of second processing path 13B, as described in greater detail below. For instance, in some embodiments, controller 20 may control a switch 49 of second processing path 13B, such that when switch 49 is activated (e.g., closed, enabled, turned on) DAC 23B may communicate a signal to amplifier stage 16 (e.g., to an inverting terminal of an operational amplifier internal to amplifier stage 16), as described in greater detail below. On the other hand, when switch 49 is deactivated (e.g., opened, disabled, turned off), DAC 23B may not communicate a signal to amplifier stage 16.

DAC 23B may receive the digital signal output by digital filter 48 via switch 49 and convert such signal into second intermediate analog signal $V_{INB}$. As shown in FIG. 4, DAC 23B may comprise a resistor ladder similar or identical to DAC 23A depicted in FIG. 3. Amplifier stage 16 of audio IC 9B may be of similar architecture to that of FIG. 3, and may interface with DAC 23B in a similar manner as amplifier stage interfaces DAC 23A in FIG. 3.

Due to their different architectures, DAC 22B and DAC 23B may have different signal processing capabilities and performance. For example, DAC 23B when converting digital audio input signal DIG_IN into second intermediate analog signal $V_{INB}$ may consume less power than does DAC 22B when converting digital audio input signal DIG_IN into first intermediate analog signal $V_{INA}$. As another example, DAC 22B may introduce lesser noise into first processing path 12B relative to noise introduced into second processing path 13B by DAC 23B. As a further example, at larger magnitudes of digital audio input signal DIG_IN, DAC 22B may provide a higher linearity in converting digital audio input signal DIG_IN into first intermediate analog signal $V_{INA}$ relative to that of DAC 23B in converting digital audio input signal DIG_IN into second intermediate analog signal $V_{INB}$.

Accordingly, controller 20 may operate to control the first gain of gain element 44 and the second gain of gain element 46 so as to effectively cross-fade the proportion of digital audio input signal DIG_IN processed by each of first processing path 12B and second processing path 13B. Thus, when a magnitude of digital audio input signal DIG_IN is lesser than a threshold magnitude, controller 20 may in essence select second processing path 13B as the active processing path by setting the second gain of gain element 46 such that the full magnitude of digital audio input signal DIG_IN is passed through gain element 46, while setting the first gain of gain element 44 to approximately zero, which may cause first processing path 12B to output first intermediate analog signal $V_{INA}$ equal to approximately zero, in order to minimize power consumption of audio IC 9B, while operating DAC 23B at a signal magnitude in which it may provide adequate linearity of second intermediate analog signal $V_{INB}$ communicated to amplifier stage 16. In these and other embodiments, when a magnitude of digital audio input signal DIG_IN is lesser than a threshold magnitude, controller 20 may also cause DAC 22B and/or other components of processing path 12B to enter its low-power state.

At magnitudes of digital audio input signal DIG_IN greater than the threshold magnitude, controller 20 may vary the first gain of gain element 44 and the second gain of gain element 46 in order to cross-fade between first processing path 12B and second processing path 13B. For example, controller 20 may increase (e.g., continuously or in steps) the first gain of gain element 44 and decrease (e.g., continuously or in steps) the second gain of gain element 46 as the magnitude of digital audio input signal DIG_IN increases and vice versa. Thus, for higher magnitudes of digital audio input signal DIG_IN, first processing path 12B may dominate providing the linearity which may be required for higher-magnitude signals, while for lower magnitudes of digital audio input signal DIG_IN, second processing path 13B may dominate, allowing for reduction in power consumption. In these and other embodiments, controller 20 may further be configured to vary the first gain and the second gain such that the sum of the first gain and the second gain remains substantially constant (e.g., unity) as the magnitude of digital audio input signal DIG_IN varies.

As in audio IC 9A of FIG. 3, in FIG. 4, the negative input of operational amplifier 22 may operate as combiner 14 of FIG. 2, thus effectively summing first intermediate analog signal $V_{INA}$ and second intermediate analog signal $V_{INB}$. In some embodiments, controller 20 may control the analog gain of amplifier stage 16 based on the magnitude of digital audio input signal DIG_IN, an identity of which of first processing path 12B and second processing path 13B is selected as an active processing path, and/or another suitable characteristic of audio IC 9B. In these and other embodiments, controller 20 may communicate one or more control signals to power supply 10, indicating an operational mode in which to operate or a supply voltage to output. For example, controller 20 may cause power supply 10 to output a supply voltage based on a magnitude of digital audio input signal DIG_IN, such that a higher supply voltage is provided for higher-magnitude signals and a lower supply voltage is provided for lower-magnitude signals, which may allow amplifier stage 16 to operate at decreased power levels when processing lower magnitude signals.

Figure 5:
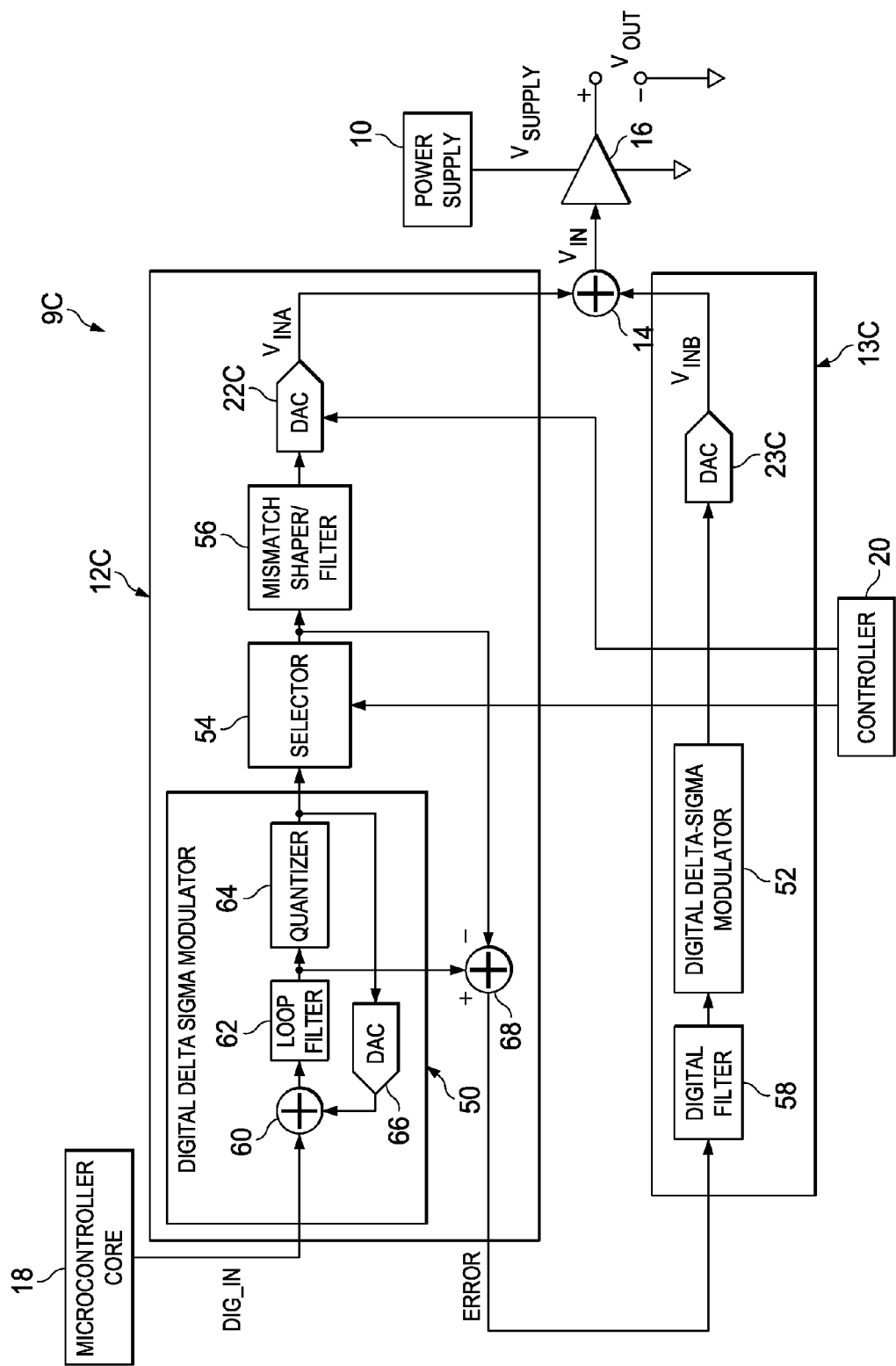
FIG. 5 illustrates a block diagram of selected components of an example integrated circuit in which portions of processing paths are implemented using a multi-stage noise-shaping structure, in accordance with embodiments of the present disclosure.

FIG. 5 illustrates a block diagram of selected components of an example audio IC 9C in which portions of processing paths 12C and 13C are implemented using a multi-stage noise-shaping structure, in accordance with embodiments of the present disclosure. In some embodiments, audio IC 9C depicted in FIG. 5 may implement all or a portion of audio IC 9 described with respect to FIG. 2. As shown in FIG. 5, microcontroller core 18 may supply digital audio input signal DIG_IN to a first processing path 12C, a portion of which may be processed by a second processing path 13C. In some embodiments, first processing path 12C and second processing path 13C depicted in FIG. 5 may respectively implement all or a portion of first processing path 12 and second processing path 13 described with respect to FIG. 2.

First processing path 12C may comprise a digital delta-sigma modulator 50, a selector 54, a mismatch shaper/filter 56, a DAC 22C, and a summer 68. Digital delta-sigma modulator 50 may comprise any suitable system, device or apparatus configured to, in the digital domain, process a first digital signal (e.g., digital audio input signal DIG_IN) to convert the first digital signal into a resulting second digital signal, which may or may not have the same number of bits as the first digital signal. In some embodiments, the resulting second digital signal may have two quantization levels (e.g., a single-bit signal or any other digital signal having two quantization levels). An example embodiment of digital delta-sigma modulator 50 is set forth in U.S. patent application Ser. No. 14/247,686 by John L. Melanson et al., filed on Apr. 8, 2014, and entitled "Systems and Methods for Generating a Digital Output Signal in a Digital Microphone System."

As shown in FIG. 5, digital delta-sigma modulator 50 may include an input summer 60, a loop filter 62, a quantizer 64, and a feedback DAC 66. Input summer 60 may generate an error signal equal to a difference between digital audio input signal DIG_IN and a feedback signal, and communicate such error signal to loop filter 62. Loop filter 62 may include one or more integrator stages, such that loop filter 62 operates as digital filter of the error signal and generates a filtered digital signal to quantizer 64 based on the error signal. The output from loop filter 62 may be quantized by quantizer 64 which may convert the filtered digital signal into another intermediate digital signal.

Feedback DAC 66 may comprise any suitable system, device, or apparatus configured to convert a digital feedback signal generated by quantizer 64 into an equivalent analog feedback signal to be summed at summer 60.

Selector 54 may comprise any system, device, or apparatus configured to selectively enable and disable first processing path 12C from producing an output signal. In some embodiments, selector 54 may comprise an AND gate or similar logical structure that implements logical conjunction such that when a control signal from received from controller 20 is deasserted (e.g., logic 0), selector 54 outputs a digital signal of value zero, and when the control signal is asserted (e.g., logic 1), selector 54 outputs a signal equal or equivalent to a digital signal output by digital delta-sigma modulator 50. In other embodiments, selector 54 may comprise a gain element configured to apply a gain to the digital signal output by digital delta-sigma modulator 50 based on a control signal from controller 20, such that the output of selector 54 may be faded continuously or in steps between zero and a value equal or equivalent to the digital signal output by digital delta-sigma modulator 50.

Mismatch shaper/filter 56 may comprise a digital filter configured to shape mismatch of digital-to-analog elements of DAC 22C. For example, in some embodiments, mismatch shaper/filter 56 may perform dynamic element matching of digital-to-analog elements of DAC 22C to reduce intersymbol interference or other signal distortive effects.

DAC 22C may receive the digital signal output by mismatch shaper/filter 56 and convert such signal into first intermediate analog signal $V_{INA}$. As shown in FIG. 5, controller 20 may communicate one or more control signals to DAC 22C configured to control operation of DAC 22C, as described in greater detail below.

Summer 68 may subtract the output of selector 54 from the output of loop filter 62, which results in an error signal ERROR indicative of a quantization error of digital delta-sigma modulator 50 when first processing path 12C is enabled by selector 54 and which may be approximately equal to digital audio input signal DIG_IN when first processing path 12C is disabled by selector 54.

Second processing path 13C may comprise a digital filter 58, a digital delta-sigma modulator 52, and a DAC 23C. Digital filter 58 may comprise any system, device, or apparatus configured to perform mathematical operations on a digital signal (e.g., error signal ERROR) to reduce or enhance certain aspects of such digital signal. For example, in some embodiments, digital filter 58 may provide latency matching between first processing path 12C and second processing path 13C. Although digital filter 58 is shown interfaced between digital delta-sigma modulator 50 and digital delta-sigma modulator 52, digital filter 58 may be placed at any suitable location within processing path 13C.

Digital delta-sigma modulator 52 may comprise any suitable system, device or apparatus configured to, in the digital domain, process a first digital signal (e.g., error signal ERROR as filtered by digital filter 58) to convert the first digital signal into a resulting second digital signal, which may or may not have the same number of bits as the first digital signal. In some embodiments, the resulting second digital signal may have two quantization levels (e.g., a single-bit signal or any other digital signal having two quantization levels). An example embodiment of digital delta-sigma modulator 42 is set forth in U.S. patent application Ser. No. 14/247,686 by John L. Melanson et al., filed on Apr. 8, 2014, and entitled "Systems and Methods for Generating a Digital Output Signal in a Digital Microphone System."

DAC 23C may receive the digital signal output by digital delta-sigma modulator 52 and convert such signal into second intermediate analog signal $V_{INB}$.

Combiner 14 may sum first intermediate analog signal $V_{INA}$ and first intermediate analog signal $V_{INB}$ to generate analog signal $V_{IN}$ to be amplified by amplifier stage 16 in order to generate output voltage $V_{OUT}$.

Controller 20 may operate to control selector 54 based on a magnitude of digital audio input signal DIG_IN. For instance, when a magnitude of digital audio input signal DIG_IN is greater than a threshold magnitude (e.g., 20 decibels below full scale magnitude of digital audio input signal DIG_IN), controller 20 may communicate a control signal enabling selector 54 to pass the output of digital delta-sigma modulator 50 to mismatch shaper/filter 56. Thus, for magnitudes of digital audio input signal DIG_IN greater than a threshold magnitude, first processing path 12C may effectively behave as a first stage of a multi-stage noise shaping (MASH) structure while second processing path 13C may effectively behave as a second stage of a MASH structure, such that second processing path 13C shapes the quantization noise/error of digital-delta sigma modulator 50.

Because such quantization error is generally significantly less than the magnitude of digital audio output signal DIG_IN, the magnitude of error signal ERROR processed by second processing path 13C is typically less than the full-scale signal magnitude processed by first processing path 12C. Accordingly, components of second processing path 13C, such as DAC 23C, may operate with lower power consumption than those of processing path 12C. Taking advantage of this feature, when a magnitude of digital audio input signal DIG_IN is lesser than the threshold magnitude, controller 20 may communicate a control signal to selector 54 such that a signal of approximately zero is communicated to mismatch shaper/filter 56. At sufficiently low magnitudes, error signal ERROR may be approximately equal to digital audio input signal DIG_IN, such that the entire magnitude of digital audio input signal DIG_IN may be processed entirely by second processing path 13C. Accordingly, at such low magnitudes, controller 20 may minimize power consumption by placing DAC 22C or other components of first processing path 12C in a low-power state.

In addition, as noted above, in some embodiments, selector 54 may act as a gain element such that the control signal communicated by controller 20 to selector 54 serves to cross-fade processing among first processing path 12C and second processing path 13C in accordance with the value of the control signal.

Figure 6:
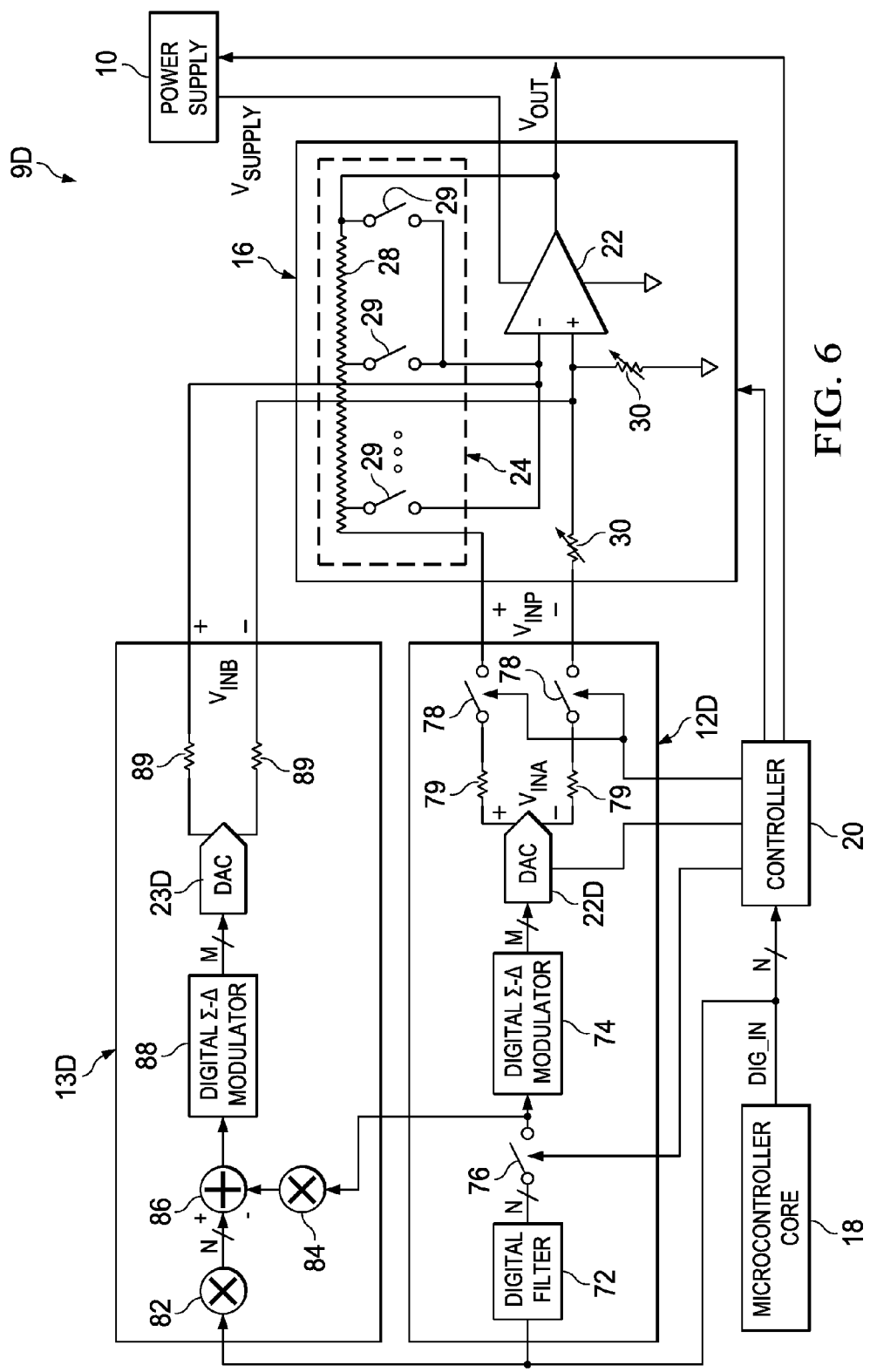
FIG. 6 illustrates a block diagram of selected components of another example integrated circuit, with detail depicting selected components of processing paths and an amplifier, in accordance with embodiments of the present disclosure.

FIG. 6 illustrates a block diagram of selected components of an example audio IC 9D, with detail depicting selected components of processing paths 12D and 13D and amplifier 16, in accordance with embodiments of the present disclosure. In some embodiments, audio IC 9D depicted in FIG. 6 may implement all or a portion of audio IC 9 described with respect to FIG. 2. As shown in FIG. 6, microcontroller core 18 may supply digital audio input signal DIG_IN to each of a first processing path 12D and a second processing path 13D. In some embodiments, first processing path 12D and second processing path 13D depicted in FIG. 6 may respectively implement all or a portion of first processing path 12 and second processing path 13 described with respect to FIG. 2.

First processing path 12D may comprise a digital filter 72, a digital delta-sigma modulator 74, a DAC 22D, switches 76 and 78, and a high-gain output which may be implemented by resistors 79. Digital filter 72 may comprise any system, device, or apparatus configured to perform mathematical operations on a digital signal (e.g., digital audio input signal DIG_IN) to reduce or enhance certain aspects of such digital signal. For example, in some embodiments, digital filter 72 may comprise a low-pass filter that filters out high-frequency components of digital audio input signal DIG_IN and passes low-frequency components of digital audio input signal DIG_IN to its input, such that low-frequency components may be processed by first processing path 12D and high-frequency components may be processed by second processing path 13D, as described in greater detail below.

Digital delta-sigma modulator 74 may comprise any suitable system, device or apparatus configured to, in the digital domain, process a first digital signal (e.g., digital audio input signal DIG_IN as filtered by digital filter 72) to convert the first digital signal into a resulting second digital signal, which may or may not have the same number of bits as the first digital signal. In some embodiments, the resulting second digital signal may have two quantization levels (e.g., a single-bit signal or any other digital signal having two quantization levels). An example embodiment of digital delta-sigma modulator 74 is set forth in U.S. patent application Ser. No. 14/247,686 by John L. Melanson et al., filed on Apr. 8, 2014, and entitled "Systems and Methods for Generating a Digital Output Signal in a Digital Microphone System."

DAC 22D may receive the digital signal output by digital delta-sigma modulator 74 and convert such signal into an analog signal. Such analog signal may then be amplified or attenuated by the high-gain output comprising resistors 79 to generate first intermediate analog signal $V_{INA}$, wherein the magnitude of the gain of the high-gain output may be a function of the resistances of resistors 79. As shown in FIG. 6, controller 20 may communicate one or more control signals to DAC 22D configured to control operation of DAC 22D, as described in greater detail below.

As also shown in FIG. 6, controller 20 may also communicate one or more control signals to first processing path 12D configured to control operation of first processing path 12D, as described in greater detail below. For instance, in some embodiments, controller 20 may control a switch 76 of first processing path 12D, such that when switch 76 is activated (e.g., closed, enabled, turned on) the output of digital filter 72 may be passed to digital delta-sigma modulator 74 and gain element 84 of second processing path 13D. On the other hand, when switch 76 is deactivated (e.g., opened, disabled, turned off), no signal may be passed to digital delta-sigma modulator 74 and gain element 84 of second processing path 13D. Furthermore, in these and other embodiments, controller 20 may control switches 78 of first processing path 12D, such that when switches 78 are activated (e.g., closed, enabled, turned on) the output of DAC 22D and the high-gain output may be passed to amplifier stage 16.

Second processing path 13D may comprise a gain element 82, a gain element 84, a combiner 86, a digital delta-sigma modulator 88, a DAC 23D, and a low-gain output which may be implemented by resistors 89. Gain element 82 may comprise any system, device, or apparatus for multiplying a gain of gain element 82 to digital audio input signal DIG_IN and communicating the resulting signal to combiner 86. In some embodiments, the gain of gain element 82 may be a fixed gain. Similarly, gain element 84 may comprise any system, device, or apparatus for multiplying a gain of gain element 84 to the output of digital filter 72 of first processing path 12D and communicating the resulting signal to combiner 86. In some embodiments, the gain of gain element 84 may be a fixed gain. In these and other embodiments, the gains of gain elements 82 and 84 may be approximately equal. Although gain elements 82 and 84 are shown as digital gain elements placed at particular locations in second processing path 13D, gain elements 82 and 84 may be placed any suitable location within processing path 13D. For example, in some embodiments, gain elements 82 and 84 may be replaced with a single gain element placed downstream of combiner 86.

Combiner 86 may comprise any system, device, or apparatus for subtracting digital audio input signal DIG_IN as filtered by digital filter 72 from an unfiltered version of digital audio input signal DIG_IN, such that combiner 86 outputs a signal representing the components of digital audio input signal DIG_IN filtered out by digital filter 72 (e.g., high-frequency components) as modified by gain elements 82 and 84.

Digital delta-sigma modulator 88 may comprise any suitable system, device or apparatus configured to, in the digital domain, process a first digital signal (e.g., the digital signal output by combiner 86) to convert the first digital signal into a resulting second digital signal, which may or may not have the same number of bits as the first digital signal. In some embodiments, the resulting second digital signal may have two quantization levels (e.g., a single-bit signal or any other digital signal having two quantization levels). An example embodiment of digital delta-sigma modulator 88 is set forth in U.S. patent application Ser. No. 14/247,686 by John L. Melanson et al., filed on Apr. 8, 2014, and entitled "Systems and Methods for Generating a Digital Output Signal in a Digital Microphone System."

DAC 23D may receive the digital signal output by digital delta-sigma modulator 88 and convert such signal into an analog signal. Such analog signal may then be amplified or attenuated by the low-gain output comprising resistors 89 to generate second intermediate analog signal $V_{INB}$, wherein the magnitude of the gain of the low-gain output may be a function of the resistances of resistors 89. In some embodiments, the gain of the high-gain output of first processing path 12D, the low-gain output of second processing path 13D, and gain elements 82 and 84 may be selected or set such that the path gains of first processing path 12D and second processing path 13D are approximately equal. For example, if gain elements 82 and 84 have a gain of K, the ratio of gain of the high-gain output to the gain of the low-gain output may also be K (e.g., resistors 89 may have resistances K times greater than resistors 79).

DAC 22D and DAC 23D may have different architectures, and thus may have different signal processing capabilities and performance. For example, DAC 23D when converting digital audio input signal DIG_IN into second intermediate analog signal $V_{INB}$ may consume less power than does DAC 22D when converting digital audio input signal DIG_IN into first intermediate analog signal $V_{INA}$. As another example, DAC 22D may introduce lesser noise into first processing path 12D relative to noise introduced into second processing path 13D by DAC 23D. As a further example, at larger magnitudes of digital audio input signal DIG_IN, DAC 22D may provide a higher linearity in converting digital audio input signal DIG_IN into first intermediate analog signal $V_{INA}$ relative to that of DAC 23D in converting digital audio input signal DIG_IN into second intermediate analog signal $V_{INB}$.

Accordingly, controller 20 may operate such that when a magnitude of digital audio input signal DIG_IN is greater than a threshold magnitude (e.g., at 20 decibels below full-scale magnitude of digital audio input signal DIG_IN), controller 20 may in essence select first processing path 12D as an active processing path, such that first processing path 12D processes signal components passed by digital filter 72 and second processing path 133D processes signal components filter by digital filter 72. In some embodiments, digital filter 72 may not be present, and in such embodiments, the output of combiner 86 may be zero such that second processing path 13D is effectively disabled. Thus, for magnitudes of digital audio input signal DIG_IN above the threshold magnitude, the higher performance first processing path 12D may handle low-frequency content (or all of the content when digital filter 72 is not present), as low-frequencies may be more likely to include most of the signal magnitude. Thus, for a magnitude of digital audio input signal DIG_IN greater than a threshold magnitude, controller 20 may communicate one or more control signals to DAC 22D indicating that DAC 22D is to operate in its high-power mode (e.g., DAC 22 is to be enabled), while communicating one or more control signals to switches 76 and 78 indicating that the first processing path 12D is to process digital audio input signal DIG_IN.

On the other hand, controller 20 may operate such that when a magnitude of digital audio input signal DIG_IN is lesser than the threshold magnitude, controller 20 may in essence select second processing path 13D as the active processing path, while masking or disabling first processing path 12D (e.g., by deactivating switches 76 and 78 and/or powering down DAC 22D), in order to minimize power consumption of audio IC 9D, while operating DAC 23D at a signal magnitude in which it may provide adequate linearity of first intermediate analog signal $V_{INB}$ communicated to amplifier stage 16. For instance, for a magnitude of digital audio input signal DIG_IN lesser than a threshold magnitude, controller 20 may communicate one or more control signals to DAC 22D indicating that DAC 22D is to operate in its low-power mode (e.g., disabling DAC 22D). Such one or more control signals may also cause first processing path 12D to output first intermediate analog signal $V_{INA}$ having an approximately zero magnitude (e.g., by disabling switches 76 and 78).

The positive and negative inputs of operational amplifier 22 may operate as combiner 14 of FIG. 2, thus effectively summing first intermediate analog signal $V_{INA}$ and second intermediate analog signal $V_{INB}$. In some embodiments, controller 20 may control the analog gain of amplifier stage 16 based on the magnitude of digital audio input signal DIG_IN, an identity of which of first processing path 12D and second processing path 13D is selected as an active processing path, and/or another suitable characteristic of audio IC 9D. In these and other embodiments, controller 20 may communicate one or more control signals to power supply 10, indicating an operational mode in which to operate or a supply voltage to output. For example, controller 20 may cause power supply 10 to output a supply voltage based on a magnitude of digital audio input signal DIG_IN, such that a higher supply voltage is provided for higher-magnitude signals and a lower supply voltage is provided for lower-magnitude signals, which may allow amplifier stage 16 to operate at decreased power levels when processing lower magnitude signals.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A processing system comprising:
   a plurality of processing paths including a first processing path and a second processing path, wherein:
      the first processing path comprises a first digital-to-analog converter for converting an entirety of a digital input signal into a first intermediate analog signal, the first digital-to-analog converter configured to operate in a high-power state and a low-power state; and
      the second processing path comprises a second digital-to-analog converter for converting at least a portion of the entirety of the digital input signal into a second intermediate analog signal; and
   an output stage configured to generate an analog signal comprising a sum of the first intermediate analog signal and the second intermediate analog signal.

2. The processing system of claim 1, wherein the second digital-to-analog converter when converting the digital input signal into the second intermediate analog signal consumes lesser power than the first digital-to-analog converter when converting the digital input signal into the first intermediate analog signal.

3. The processing system of claim 1, wherein the first digital-to-analog converter introduces lesser noise into the first processing path relative to noise introduced by the second digital-to-analog converter into the second processing path.

4. The processing system of claim 1, wherein the second digital-to-analog converter comprises a resistor ladder comprising a plurality of resistors each coupled to each other at respective first terminals and each coupled at their respective second terminals to a corresponding driver driving a signal indicative of a value of a single bit of the digital input signal.

5. The processing system of claim 1, further comprising a controller configured to operate the first digital-to-analog converter in the low-power state when a magnitude of the digital input signal is below a threshold magnitude.

6. The processing system of claim 5, wherein the controller is further configured to, when the magnitude of the digital input signal is below the threshold magnitude, cause the first processing path to output the first intermediate analog signal having an approximately zero magnitude.

7. The processing system of claim 6, wherein the controller is further configured to, when the magnitude of the digital input signal is above the threshold magnitude, cause the second processing path to output the second intermediate analog signal having an approximately zero magnitude.

8. The processing system of claim 5, wherein:
   the first processing path comprises a first gain element configured to apply a first gain to the first processing path;
   the second processing path comprises a second gain element configured to apply a second gain to the second processing path; and
   the controller is further configured to vary the first gain and the second gain based on the magnitude of the digital input signal, such that the sum of the first gain and the second gain remains substantially constant as the magnitude of the digital input signal varies.

9. The processing system of claim 8, wherein the controller is further configured to vary the first gain and the second gain such that, when the magnitude of the digital input signal is above the threshold magnitude:
   the first gain increases as the magnitude of the digital input signal increases and vice versa; and
   the second gain increases as the magnitude of the digital input signal decreases and vice versa.

10. The processing system of claim 5, wherein for magnitudes of the digital input signal above the threshold magnitude, noise introduced by the second digital-to-analog converter is at least partially cancelled by the first digital-to-analog converter.

11. The processing system of claim 5, wherein the controller is further configured to:
   when the magnitude of the digital input signal is above the threshold magnitude, cause the first processing path and second processing path to both process the digital input signal to generate the analog signal; and
   when the magnitude of the digital input signal is below the threshold magnitude, cause the second processing path to fully process the digital input signal.

12. The processing system of claim 11, wherein the controller is further configured to, when the magnitude of the digital input signal is above the threshold magnitude:
   cause the first processing path to process components of the digital input signal below a particular frequency; and cause the second processing path to process components of the digital input signal above the particular frequency.

13. The processing system of claim 1, further comprising a multi-stage noise shaping structure, wherein the first processing path includes a first stage of the multi-stage noise-shaping structure and the second processing path includes a second stage of the multi-stage noise-shaping structure.

14. The processing system of claim 13, further comprising a controller configured to operate the first digital-to-analog converter in the low-power state when a magnitude of the digital input signal is below a threshold magnitude.

15. The processing system of claim 14, wherein the controller is further configured to, when the magnitude of the digital input signal is below the threshold magnitude, cause the first processing path to output the first intermediate analog signal having an approximately zero magnitude.

16. The processing system of claim 15, wherein the controller is further configured to, when the magnitude of the digital input signal is below the threshold magnitude, cause the first stage of the multi-stage noise-shaping structure to operate in a low power mode.

17. The processing system of claim 15, wherein the controller is further configured to:
when the magnitude of the digital input signal is above the threshold magnitude, cause the first processing path and second processing path to both process the digital input signal to generate the analog signal; and
when the magnitude of the digital input signal is below the threshold magnitude, cause the second processing path to fully process the digital input signal.

18. A method comprising:
generating a first intermediate analog signal with a first processing path comprising a first digital-to-analog converter for converting an entirety of a digital input signal into the first intermediate analog signal, the first digital-to-analog converter configured to operate in a high-power state and a low-power state;
generating a second intermediate analog signal with a second processing path comprising a second digital-to-analog converter for converting at least a portion of the entirety of the digital input signal into the second intermediate analog signal;
generating an analog signal comprising a sum of the first intermediate analog signal and the second intermediate analog signal.

19. The method of claim 18, wherein the second digital-to-analog converter when converting the digital input signal into the second intermediate analog signal consumes lesser power than the first digital-to-analog converter when converting the digital input signal into the first intermediate analog signal.

20. The method of claim 18, wherein the first digital-to-analog converter introduces lesser noise into the first processing path relative to noise introduced by the second digital-to-analog converter into the second processing path.

21. The method of claim 18, wherein the second digital-to-analog converter comprises a resistor ladder comprising a plurality of resistors each coupled to each other at respective first terminals and each coupled at their respective second terminals to a corresponding driver driving a signal indicative of a value of a single bit of the digital input signal.

22. The method of claim 18, further comprising:
applying a first gain to the first processing path;
applying a second gain to the second processing path; and
varying the first gain and the second gain based on a magnitude of the digital input signal, such that the sum of the first gain and the second gain remains substantially constant as the magnitude of the digital input signal varies.

* * * * *